US012624445B2

(12) United States Patent　　(10) Patent No.:　US 12,624,445 B2
Kikuchi et al.　　(45) Date of Patent:　May 12, 2026

(54) METHOD FOR REMOVING MOLYBDENUM MONOFLUORIDE TO MOLYBDENUM PENTAFLUORIDE AND METHOD FOR PRODUCING SEMICONDUCTOR DEVICE

(71) Applicant: CENTRAL GLASS CO., LTD., Ube (JP)

(72) Inventors: Akiou Kikuchi, Yamaguchi (JP); Masato Shinagawa, Yamaguchi (JP)

(73) Assignee: CENTRAL GLASS CO., LTD., Ube (JP)

( * ) Notice: Subject to any disclaimer, the term of this patent is extended or adjusted under 35 U.S.C. 154(b) by 33 days.

(21) Appl. No.: 18/576,416

(22) PCT Filed: Jun. 29, 2022

(86) PCT No.: PCT/JP2022/026026
§ 371 (c)(1),
(2) Date: Jan. 4, 2024

(87) PCT Pub. No.: WO2023/282152
PCT Pub. Date: Jan. 12, 2023

(65) Prior Publication Data
US 2024/0368755 A1　　Nov. 7, 2024

(30) Foreign Application Priority Data
Jul. 5, 2021　　(JP) ................................. 2021-111738

(51) Int. Cl.
*C23C 16/44*　　(2006.01)
*C23C 16/14*　　(2006.01)
*H10P 14/40*　　(2026.01)

(52) U.S. Cl.
CPC .......... *C23C 16/4405* (2013.01); *C23C 16/14* (2013.01); *H10P 14/412* (2026.01)

(58) Field of Classification Search
None
See application file for complete search history.

(56) References Cited

U.S. PATENT DOCUMENTS

| | | |
|---|---|---|
| 2018/0327913 A1 | 11/2018 | Lansalot-Matras et al. |
| 2021/0115556 A1 | 4/2021 | Nagatomo et al. |
| 2021/0155498 A1 | 5/2021 | Shibusawa et al. |

FOREIGN PATENT DOCUMENTS

| | | | | |
|---|---|---|---|---|
| JP | 2019-502253 | 1/2019 | | |
| JP | 2019-019365 | 2/2019 | | |
| JP | 2019-031715 | 2/2019 | | |
| JP | 201919365 | * 2/2019 | .............. | C01G 1/06 |
| JP | 2019-096650 | 6/2019 | | |
| KR | 10-2020-0027995 | 3/2020 | | |
| TW | 201908513 | 3/2019 | | |
| TW | 201933471 | 8/2019 | | |
| WO | 2019-189715 | 10/2019 | | |

OTHER PUBLICATIONS

JP201919365 English translation, accessed on May 2025. (Year: 2019).*
H. Selig et al., "Hydrolysis reactions of transition metal fluorides in liquid hydrogen fluoride Oxonium salts with Nb, Ta and W," J. Flu. Chem, 11, 6, 1978, pp. 629-635.
R.L. Richards, "Chapter 5, The Halides of Molybdenum," Stu. Inorg. Chem, 19, 1994, pp. 251-276.
International Search Report and Written Opinion of PCT/JP2022/026026, Sep. 13, 2022, 10 pages including English translation of the International Search Report.
Taiwanese Office Action issued in Taiwanese Application No. 111125075, issued Aug. 5, 2025, 11 pages, English translation provided.
Korean Office Action issued in KR Application No. 10-2023-7045467, dated Jul. 15, 2025, 17 pages, English machine translation.

* cited by examiner

*Primary Examiner* — Kaj K Olsen
*Assistant Examiner* — Arlyn I Rivera-Cordero
(74) *Attorney, Agent, or Firm* — HSML P.C.

(57) ABSTRACT

The present invention relates to a method for removing $MoF_x$ or $MoF_x$ and $MoOF_x$, including: bringing a halogen-containing gas into contact with a member having a deposit or a coating of $MoF_x$ or $MoF_x$ and $MoOF_x$ (where x represents a number greater than 0 and less than 6); and removing $MoF_x$ or $MoF_x$ and $MoOF_x$ from the member, a method for removing a deposit or a coating from a member having the deposit or the coating of $MoF_x$ or $MoF_x$ and $MoOF_x$ mixed as impurities in $MoF_6$ by a method for producing a semiconductor device including the above removing method, and a method for producing a semiconductor device that includes removing a deposit or a coating from a semiconductor device production apparatus having a deposit or coating of $MoF_x$ or $MoF_x$ and $MoOF_x$, and that can avoid clogging or contamination of the production apparatus.

14 Claims, No Drawings

METHOD FOR REMOVING MOLYBDENUM MONOFLUORIDE TO MOLYBDENUM PENTAFLUORIDE AND METHOD FOR PRODUCING SEMICONDUCTOR DEVICE

TECHNICAL FIELD

The present invention relates to a method for removing molybdenum monofluoride to molybdenum pentafluoride and a method for producing a semiconductor device.

BACKGROUND ART

Molybdenum hexafluoride ($MoF_6$) is used as a raw material for depositing molybdenum metal by chemical vapor deposition (CVD) in production of semiconductor devices, solar cells, and the like.

In addition, $MoF_6$ is used as an etching material in a process of producing a semiconductor device (Patent Literature 1).

Paragraph in Patent Literature 2 discloses that unreacted elemental metal (Mo) and intermediates of molybdenum monofluoride to molybdenum pentafluoride ($MoF$, $MoF_2$, $MoF_3$, $MoF_4$, $MoF_5$) may be mixed as impurities during the production of $MoF_6$, and such impurities not only cause a decrease in a purity of $MoF_6$, but also may accumulate inside a reaction device, and this may cause a problem of clogging in a reaction system and a problem in maintenance of the reaction device.

CITATION LIST

Patent Literature

Patent Literature 1: JP2019-502253A
Patent Literature 2: WO 2019/189715

SUMMARY OF INVENTION

Technical Problem

A method for removing a deposit or a coating of $MoF_x$ (x represents a number greater than 0 and less than 6, and the same applies to x below), or $MoF_x$ and $MoOF_x$, from a member having the deposit or the coating of $MoF_x$ mixed as impurities in $MoF_6$, or a member having the deposit or the coating of $MoF_x$ and $MoOF_x$ mixed as impurities in MoF 6 is desired.

In addition, when $MoF_6$ is used as a film-forming material or an etching material for Mo in the process of producing a semiconductor device, a method for stably producing a semiconductor device that includes removing a deposit or a coating of $MoF_x$ or a deposit or a coating of $MoF_x$ and $MoOF_x$, from a semiconductor device production apparatus (for example, a chamber or a pipe) having a deposit or a coating of $MoF_x$ or a deposit or a coating of $MoF_x$ and $MoOF_x$ mixed as impurities in $MoF_6$, and that can avoid clogging and contamination of the production apparatus is desired.

The present invention has been made in view of the above circumstances, and an object thereof is to provide a method for removing a deposit or a coating of $MoF_x$ or $MoF_x$ and $MoOF_x$ mixed as impurities in $MoF_6$ from a member having the deposit or the coating of $MoF_x$ or $MoF_x$ and $MoOF_x$, and a method for producing a semiconductor device that includes removing a deposit or a coating of $MoF_x$ or $MoF_x$ and $MoOF_x$ from a semiconductor device production apparatus (for example, a chamber or a pipe) having the deposit or the coating of $MoF_x$ or $MoF_x$ and $MoOF_x$, and that can avoid clogging or contamination of the production apparatus.

Solution to Problem

As a result of extensive studies in view of such a problem, the present inventors have found that when a member having a deposit or a coating of $MoF_x$ or $MoF_x$ and $MoOF_x$ is brought into contact with a halogen-containing gas, the deposit or the coating can be removed from the member.

That is, the present inventors have found that the above problem can be solved by the following configurations.

[1]
A method for removing $MoF_x$ or $MoF_x$ and $MoOF_x$, including:
  bringing a halogen-containing gas into contact with a member having a deposit or a coating of $MoF_x$ or $MoF_x$ and $MoOF_x$; and
  removing $MoF_x$ or $MoF_x$ and $MoOF_x$ from the member, where x represents a number greater than 0 and less than 6.

[2]
The method for removing $MoF_x$ or $MoF_x$ and $MoOF_x$ according to [1], in which the halogen-containing gas is a gas of a compound having a bond between a fluorine atom and an atom other than the fluorine atom, and a bond energy between the fluorine atom and the atom other than the fluorine atom is 2.5 eV or less.

[3]
The method for removing $MoF_x$ or $MoF_x$ and $MoOF_x$ according to [2], in which the bond energy is 1.7 eV or more and 2.5 eV or less.

[4]
The method for removing $MoF_x$ or $MoF_x$ and $MoOF_x$ according to [1], in which the halogen-containing gas is a fluorine-containing gas.

[5]
The method for removing $MoF_x$ or $MoF_x$ and $MoOF_x$ according to [1], in which the halogen-containing gas is a fluorine gas.

[6]
The method for removing $MoF_x$ or $MoF_x$ and $MoOF_x$ according to any one of [1] to [5], in which the member with which the halogen-containing gas is brought into contact has a temperature of 0° C. to 400° C.

[7]
A method for producing a semiconductor device including:
  (1) circulating a gas containing $MoF_6$ in a semiconductor processing apparatus including a chamber and a pipe connected to the chamber to bring $MoF_6$ into contact with a semiconductor substrate; and
  (2) bringing a halogen-containing gas into contact with at least one of the chamber and the pipe having a deposit or coating of $MoF_x$ or $MoF_x$ and $MoOF_x$, in which where x represents a number greater than 0 and less than 6.

[8]
The method for producing a semiconductor device according to [7], in which the halogen-containing gas is a gas of a compound having a bond between a fluorine atom and an atom other than the fluorine atom, and a bond energy between the fluorine atom and the atom other than the fluorine atom is 2.5 eV or less.

[9]

The method for producing a semiconductor device according to [8], in which the bond energy is 1.7 eV or more and 2.5 eV or less.

[10]

The method for producing a semiconductor device according to [7], in which the halogen-containing gas is a fluorine-containing gas.

[11]

The method for producing a semiconductor device according to [7], in which the halogen-containing gas is a fluorine gas.

[12]

The method for producing a semiconductor device according to any one of [7] to [11], in which at least one of the chamber or the pipe with which the halogen-containing gas is brought into contact has a temperature of 0° C. to 400° C.

Advantageous Effects of Invention

The present invention allows for providing a method for removing a deposit or a coating of $MoF_x$ or $MoF_x$ and $MoOF_x$ mixed as impurities in $MoF_6$, from a member having the deposit or the coating of $MoF_x$ or $MoF_x$ and $MoOF_x$, and a method for stably producing a semiconductor device that includes removing a deposit or a coating from a semiconductor device production apparatus (for example, a chamber or a pipe) having a deposit or coating of $MoF_x$ or $MoF_x$ and $MoOF_x$, and that can avoid clogging or contamination of the production apparatus.

DESCRIPTION OF EMBODIMENTS

Configurations and combinations thereof in the following embodiments are merely examples, and configuration additions, omissions, replacements, and other changes are possible without departing from the scope of the present invention. In addition, the present invention is not limited by the embodiments.

In the present description, the expression "to" is used to include numerical values before and after it as a lower limit value and an upper limit value.

[Method for Removing $MoF_x$ or $MoF_x$ and $MoOF_x$]

A method for removing $MoF_x$ or $MoF_x$ and $MoOF_x$ according to the present invention is a method for removing $MoF_x$ or $MoF_x$ and $MoOF_x$ including: bringing a halogen-containing gas into contact with a member having a deposit or coating of $MoF_x$ or $MoF_x$ and $MoOF_x$; and removing $MoF_x$ or $MoF_x$ and $MoOF_x$ from the member. where x represents a number greater than 0 and less than 6.

Although details of a mechanism of removing $MoF_x$ or $MoF_x$ and $MoOF_x$ by the removing method according to the present invention are not clear, the present inventors presume as follows.

Molybdenum monofluoride to molybdenum pentafluoride ($MoF_x$, or $MoF_x$ and $MoOF_x$) have a boiling point higher than a boiling point of $MoF_6$, and tend to remain on a surface of a member or inside a semiconductor device production apparatus. For example, $MoF_6$ has a boiling point of 35° C. at 1 atm, whereas $MoF_5$ has a boiling point of 214° C. at 1 atm.

As described above, $MoF_x$ or $MoF_x$ and $MoOF_x$ have a high boiling point, and thus tend to remain on the surface of the member and inside the semiconductor device production apparatus.

In the present invention, it is considered that when a halogen-containing gas is brought into contact with $MoF_x$ or $MoF_x$ and $MoOF_x$, $MoF_x$ or $MoF_x$ and $MoOF_x$ can be oxidized and converted to compounds having lower boiling points, and $MoF_x$ or $MoF_x$ and $MoOF_x$ can be removed.

$MoF_x$ as a removal target may be $MoF_x$ and an oxyfluoride ($MoOF_x$) to which a part (for example, a surface layer) of $MoF_x$ changed. When the above $MoF_x$ is deposited or coated and the chamber is open to an active atmosphere containing air or the like, the surface layer may be an oxyfluoride (see, for example, J. Flu. Chem, 11, 6, 629 (1978) and Stu. Inorg. Chem, 19, 251 (1994)). The removing method and a method for producing a semiconductor device according to the present invention can also be applied to $MoF_x$ whose surface is oxidized. When $MoF_x$ and $MoOF_x$ are mixed, the mixture may be collectively referred to as "$MoO_yF_z$" based on abundance ratios thereof. In this case, y is greater than 0 and less than 3 and z is greater than 0 and less than 6. Weight measurement of the deposit allows to confirm that the deposit is $MoF_x$. In addition, X-ray diffraction (XRD) measurement and weight measurement of the deposit allows to confirm that the deposit is a mixture of $MoF_x$ and $MoOF_x$.

(Halogen-Containing Gas)

The halogen-containing gas is not limited as long as it is a gas containing halogen, and is preferably a fluorine-containing gas (a gas containing fluorine).

Examples of the fluorine-containing gas include a fluorine gas ($F_2$ gas), a chlorine fluoride gas (ClF gas), a chlorine trifluoride gas ($ClF_3$ gas), a bromine fluoride gas (BrF gas), a bromine trifluoride gas ($BrF_3$ gas), a bromine pentafluoride gas ($BrF_5$ gas), an iodine pentafluoride gas ($IF_5$ gas), an iodine heptafluoride gas ($IF_7$ gas), an oxygen difluoride gas ($OF_2$ gas), a xenon difluoride gas ($XeF_2$ gas), a xenon tetrafluoride gas ($XeF_4$ gas), a molybdenum hexafluoride gas ($MoF_6$ gas), a $NF_3$ gas, a $CF_4$ gas, a $C_2F_6$ gas, or a mixed gas thereof.

Preferably, the halogen-containing gas is a gas of a compound having a bond between a fluorine atom and an atom other than the fluorine atom, and a bond energy between the fluorine atom and the atom other than the fluorine atom is 2.5 eV or less. The "atom other than the fluorine atom" may be a fluorine atom. Examples of the gas include a compound represented by the following formula (1).

$$MF_n \tag{1}$$

[M is a fluorine atom, a chlorine atom, a bromine atom, an iodine atom, an oxygen atom, or a rare gas (argon, xenon or krypton) atom, and n is a number of 1 to 7.]

Specifically, the compound represented by the formula (1) is preferably a fluorine gas ($F_2$ gas), a chlorine trifluoride gas ($ClF_3$ gas), an iodine heptafluoride gas ($IF_7$ gas), or a molybdenum hexafluoride gas ($MoF_6$ gas), more preferably a chlorine trifluoride gas ($ClF_3$ gas) or an iodine heptafluoride gas ($IF_7$ gas), and particularly preferably a chlorine trifluoride gas ($ClF_3$ gas).

More preferably, the halogen-containing gas is a gas of a compound having a bond between a fluorine atom and an atom other than the fluorine atom, and the bond energy between the fluorine atom and the atom other than the fluorine atom is 1.7 eV or more and 2.5 eV or less.

The halogen-containing gas may be diluted with an inert gas such as a nitrogen gas, helium, argon or neon.

(Member)

The member to which the method for removing $MoF_x$ or $MoF_x$ and $MoOF_x$ according to the present invention is applied is not limited.

The member is, for example, a pipe, a chamber, or a storage container.

A material constituting the member is not limited, but is preferably a metal, and examples thereof include a metal such as stainless steel, manganese steel, aluminum, an aluminum alloy, nickel, and a nickel alloy.

The stainless steel is not limited, but for example, martensitic stainless steel, ferritic stainless steel, austenitic stainless steel, and other stainless steel can be used. SUS304, SUS304L, SUS316, and SUS316L are particularly preferred.

The manganese steel is not limited, but for example, SMn420, SMn433, SMn438, and SMn443 defined in JIS G 4053:2016, or STH11 and STH12 defined in JIS G 3429: 2013 can be used.

The aluminum alloy is not limited, but for example, alloys of aluminum with copper, manganese, silicon, magnesium, zinc, nickel, or the like can be used.

The nickel alloy is not limited, but for example, Hastelloy or Inconel can be used.

The surface of the member may be subjected to mirror finishing, acid washing, electropolishing, or surface coating.

A temperature of the member with which the halogen-containing gas is brought into contact is not limited, but is preferably 0° C. to 400° C., more preferably 20° C. to 200° C., and still more preferably 40° C. to 150° C.

A pressure during the contact with the halogen-containing gas is not limited, but can be appropriately set in a range of, for example, $1 \times 10^{-5}$ kPa to 1000 kPa, preferably $1 \times 10^{-4}$ kPa to 300 kPa, and more preferably $1 \times 10^{-3}$ kPa to 100 kPa.

A time of the contact with the halogen-containing gas is not limited, but can be appropriately set in a range of, for example, 1 second or longer and 24 hours or shorter, preferably 10 seconds or longer and 10 hours or shorter, and more preferably 30 seconds or longer and 1 hour or shorter.

[Method for Producing Semiconductor Device]

The method for producing a semiconductor device according to the present invention is a method for producing a semiconductor device including:

(1) circulating a gas containing $MoF_6$ in a semiconductor processing apparatus including a chamber and a pipe connected to the chamber to bring $MoF_6$ into contact with a semiconductor substrate; and (2) bringing a halogen-containing gas into contact with at least one of the chamber and the pipe having a deposit or a coating of $MoF_x$ or $MoF_x$ and $MoOF_x$, where x represents a number greater than 0 and less than 6.

A material constituting the chamber of the semiconductor processing apparatus and a material constituting the pipe connected to the chamber in the method for producing a semiconductor device according to the present invention are the same as the material constituting the member described in the above method for removing $MoF_x$ or $MoF_x$ and $MoOF_x$.

The gas containing $MoF_6$ in the above step (1) may be a gas containing 100 vol % of $MoF_6$, or a gas obtained by diluting $MoF_6$ with an inert gas such as nitrogen or argon.

When the gas containing $MoF_6$ is circulated in the semiconductor processing apparatus, for example, a Mo film can be formed on the substrate. Alternatively, when the gas containing $MoF_6$ is circulated in the semiconductor processing apparatus, for example, from a substrate having a layer such as an oxide film formed thereon, at least a part of the layer can be etched. By performing these treatments, a semiconductor device can be produced.

The above step (2) is bringing a halogen-containing gas into contact with $MoF_x$ or $MoF_x$ and $MoOF_x$ that is deposited and coated and mixed as impurities in $MoF_6$ used in the step (1). By the contact with the halogen-containing gas, $MoF_x$ or $MoF_x$ and $MoOF_x$ can be removed and the clogging or contamination of the production apparatus can be avoided.

The halogen-containing gas in the above step (2) is the same as the halogen-containing gas described in the above method for removing $MoF_x$ or $MoF_x$ and $MoOF_x$.

A temperature of at least one member of the chamber and the pipe with which the halogen-containing gas is brought into contact is not limited, but is preferably 0° C. to 400° C., more preferably 20° C. to 200° C., and still more preferably 40° C. to 150° C.

A pressure during the contact with the halogen-containing gas is not limited, but can be appropriately set in a range of, for example, $1 \times 10^{-5}$ kPa to 1000 kPa, preferably $1 \times 10^{-4}$ kPa to 300 kPa, and more preferably $1 \times 10^{-3}$ kPa to 100 kPa.

A time of the contact with the halogen-containing gas is not limited, but can be appropriately set in a range of, for example, 1 second or longer and 24 hours or shorter, preferably 10 seconds or longer and 10 hours or shorter, and more preferably 30 seconds or longer and 1 hour or shorter.

EXAMPLE

The present invention will be described in more detail below with reference to Examples, but the present invention is not limited by these descriptions.

Experiments using an actual semiconductor production apparatus to deposit and clog $MoF_x$ or $MoF_x$ and $MoOF_x$, and to bring $MoF_x$ or $MoF_x$ and $MoOF_x$ into contact with a predetermined gas such as a halogen-containing gas are difficult due to restrictions on the apparatus. Therefore, in the present Examples, $MoF_x$ or $MoF_x$ and $MoOF_x$ as removal targets were produced on purpose in a model experiment, and the method according to the present invention was applied thereto for evaluation.

<Model Experiment (1)> Reproduction of Deposition of $MoF_x$

To a Ni tube having a tube diameter of 25 mm and a volume of 100 ml was charged a Mo powder, thereafter $MoF_6$ was introduced. The Ni tube was sealed, followed by a reaction for 1 hour under conditions of an internal temperature of 150° C. and an internal pressure of 70 kPa, thereby depositing $MoF_x$ (x represents a number greater than 0 and less than 6) on purpose. It was confirmed based on a weight increase amount of the deposit, that an average composition thereof was MoF 3.0.

(Comparative Example 1) Contact of Oxygen Gas with $MoF_x$

To a container containing the deposit obtained in the model experiment (1) was introduced an oxygen gas, which is a combustion-supporting gas sometimes used for chamber cleaning. The oxygen gas was brought into contact with the deposit at an internal temperature of 100° C. and an internal pressure of 10 kPa. However, the deposit was still present in the container even after 1 hour of contact.

(Example 1-1) Contact of Fluorine Gas with $MoF_x$

To a container containing the deposit obtained in the model experiment (1) was introduced a fluorine gas as a halogen-containing gas. The fluorine gas was brought into contact with the deposit at an internal temperature of 100° C. and an internal pressure of 10 kPa, 34.3 mass % of the deposit disappeared after 2 minutes of contact. In addition, after 10 minutes of contact, the entire deposit disappeared.

(Example 1-2) Contact of $ClF_3$ Gas with $MoF_x$

To a container containing the deposit obtained in the model experiment (1) was introduced a chlorine trifluoride gas as a halogen-containing gas. The chlorine trifluoride gas was brought into contact with the deposit at an internal temperature of 100° C. and an internal pressure of 10 kPa, 87.1 mass % of the deposit disappeared after 2 minutes of contact. In addition, after 4 minutes of contact, the entire deposit disappeared.

(Example 1-3) Contact of $IF_7$ Gas with $MoF_x$

To a container containing the deposit obtained in the model experiment (1) was introduced an iodine heptafluoride gas as a halogen-containing gas. The iodine heptafluoride gas was brought into contact with the deposit at an internal temperature of 100° C. and an internal pressure of 10 kPa, 41.0 mass % of the deposit disappeared after 2 minutes of contact. In addition, after 8 minutes of contact, the entire deposit disappeared.

(Example 1-4) Contact of $MoF_6$ Gas with $MoF_x$

To a container containing the deposit obtained in the model experiment (1) was introduced a molybdenum hexafluoride gas as a halogen-containing gas. The molybdenum hexafluoride gas was brought into contact with the deposit at an internal temperature of 100° C. and an internal pressure of 10 kPa, 41.0 mass % of the deposit disappeared after 2 minutes of contact. In addition, after 8 minutes of contact, the entire deposit disappeared.

<Model Experiment (2)> Reproduction of Deposition of Mixture of $MoF_x$ and Oxyfluoride thereof ($MoOF_x$)

To a Ni tube having a tube diameter of 25 mm and a volume of 100 ml was charged a $MoO_3$ powder, thereafter $MoF_6$ was introduced. The Ni tube was sealed, followed by a reaction for 1 hour under conditions of an internal temperature of 170° C. and an internal pressure of 70 kPa, thereby depositing a mixture of $MoF_x$ and $MoOF_x$ (x represents a number greater than 0 and less than 6) on purpose. By X-ray diffraction (XRD) measurement and weight measurement of the deposit, it was confirmed that the deposit was a mixture of $MoF_x$ and $MoOF_x$.

(Comparative Example 2) Contact of Oxygen Gas with Mixture of $MoF_x$ and $MoOF_x$ To a container containing the deposit obtained in the model experiment (2) was introduced an oxygen gas, which is a combustion-supporting gas sometimes used for chamber cleaning. The oxygen gas was brought into contact with the deposit at an internal temperature of 130° C. and an internal pressure of 10 kPa, but the deposit was still present in the container even after 1 hour of contact.

(Example 2-1) Contact of Fluorine Gas with Mixture of $MoF_x$ and $MoOF_x$

To a container containing the deposit obtained in the model experiment (2) was introduced a fluorine gas as a halogen-containing gas. The fluorine gas was brought into contact with the deposit at an internal temperature of 130° C. and an internal pressure of 10 kPa, 28.1 mass % of the deposit disappeared after 2 minutes of contact. In addition, after 10 minutes of contact, the entire deposit disappeared.

(Example 2-2) Contact of $ClF_3$ Gas with Mixture of $MoF_x$ and $MoOF_x$

To a container containing the deposit obtained in the model experiment (2) was introduced a chlorine trifluoride gas as a halogen-containing gas. The chlorine trifluoride gas was brought into contact with the deposit at an internal temperature of 130° C. and an internal pressure of 10 kPa, 92.6 mass % of the deposit disappeared after 2 minutes of contact. In addition, after 4 minutes of contact, the entire deposit disappeared.

(Example 2-3) Contact of $IF_7$ Gas with Mixture of $MoF_x$ and $MoOF_x$

To a container containing the deposit obtained in the model experiment (2) was introduced an iodine heptafluoride gas as a halogen-containing gas. The iodine heptafluoride gas was brought into contact with the deposit at an internal temperature of 130° C. and an internal pressure of 10 kPa, 31.0 mass % of the deposit disappeared after 2 minutes of contact. In addition, after 8 minutes of contact, the entire deposit disappeared.

(Example 2-4) Contact of $MoF_6$ Gas with Mixture of $MoF_x$ and $MoOF_x$

To a container containing the deposit obtained in the model experiment (2) was introduced a molybdenum hexafluoride gas as a halogen-containing gas. The molybdenum hexafluoride gas was brought into contact with the deposit at an internal temperature of 130° C. and an internal pressure of 10 kPa, 31.0 mass % of the deposit disappeared after 2 minutes of contact. In addition, after 8 minutes of contact, the entire deposit disappeared.

Table 1 below summarizes removal rates in the above Examples and Comparative Examples after contact for 2 minutes with each of the gases used.

TABLE 1

| Removal target | Gas species | Bond energy* [eV] | Temperature [° C.] | Pressure [kPa] | Contact time [min.] | Removal rate [mass %] | |
|---|---|---|---|---|---|---|---|
| $MoF_x$ | $O_2$ | — | 100 | 10 | 2 | <1 | Comparative Example 1 |
| | $F_2$ | 1.6 | 100 | 10 | 2 | 34.3 | Example 1-1 |
| | $ClF_3$ | 1.8 | 100 | 10 | 2 | 87.1 | Example 1-2 |
| | $IF_7$ | 2.4 | 100 | 10 | 2 | 41.0 | Example 1-3 |

TABLE 1-continued

| Removal target | Gas species | Bond energy* [eV] | Temperature [° C.] | Pressure [kPa] | Contact time [min.] | Removal rate [mass %] | |
|---|---|---|---|---|---|---|---|
| Mixture of $MoF_x$ and $MoOF_x$ | $O_2$ | — | 130 | 10 | 2 | <1 | Comparative Example 2 |
| | $F_2$ | 1.6 | 130 | 10 | 2 | 28.1 | Example 2-1 |
| | $ClF_3$ | 1.8 | 130 | 10 | 2 | 92.6 | Example 2-2 |
| | $IF_7$ | 2.4 | 130 | 10 | 2 | 31.0 | Example 2-3 |

*the bond energy between a fluorine atom and an atom other than the fluorine atom when the halogen-containing gas is a compound gas containing a bond between the fluorine atom and the atom other than the fluorine atom As is clear from Table 1, the removing method according to the present invention of contact with the halogen-containing gas has a high removal rate of $MoF_x$ or $MoF_x$ and $MoOF_x$.

INDUSTRIAL APPLICABILITY

The present invention allows for providing a method for removing a deposit or a coating of $MoF_x$ or $MoF_x$ and $MoOF_x$ mixed as impurities in $MoF_6$, from a member having the deposit or the coating of $MoF_x$ or $MoF_x$ and $MoOF_x$, and a method for stably producing a semiconductor device that includes removing a deposit or a coating from a semiconductor device production apparatus (for example, a chamber or a pipe) having a deposit or coating of $MoF_x$ or $MoF_x$ and $MoOF_x$, and that can avoid clogging or contamination of the production apparatus.

Although the present invention has been described in detail and with reference to specific examples, it will be apparent to those skilled in the art that various changes and modifications can be made without departing from the spirit and scope of the present invention.

The present application is based on a Japanese Patent Application (No. 2021-111738) filed on Jul. 5, 2021, the contents of which are incorporated herein by reference.

The invention claimed is:

1. A method for producing a semiconductor device comprising:

circulating a gas containing $MoF_6$ in a semiconductor processing apparatus comprising: a chamber and a pipe connected to the chamber, so as to bring the $MoF_6$ in the gas into contact with a semiconductor substrate; and bringing a halogen-containing gas into contact with at least one of the chamber and the pipe, each having a deposit or coating of (i) the $MoF_x$, or (ii) a mixture of the $MoF_x$ and $MoOF_x$, where x represents a number greater than 0 and less than 6, wherein the halogen-containing gas oxidizes (i) the $MoF_x$, or (ii) the mixture of $MoF_x$ and $MoOF_x$ present in the deposit or the coating, so as to form a compound having a lower boiling point than a boiling point of (i) the $MoF_x$, or a boiling point of (ii) the mixture of $MoF_x$ and $MoOF_x$, present in the deposit or the coating, respectively.

2. The method for producing a semiconductor device according to claim 1, wherein the halogen-containing gas is a fluorine-containing gas.

3. The method for producing a semiconductor device according to claim 1, wherein the halogen-containing gas is a fluorine gas.

4. The method for producing a semiconductor device according to claim 1, wherein at least one of the chamber or the pipe with which the halogen-containing gas is brought into contact has a temperature in a range from 0° C. to 400° C.

5. The method according to claim 1, wherein the halogen-containing gas is selected from the group consisting of fluorine gas ($F_2$), chlorine trifluoride ($ClF_3$), iodine heptafluoride ($IF_7$), and molybdenum hexafluoride ($MoF_6$).

6. The method for producing a semiconductor device according to claim 1, wherein the halogen-containing gas is a gas of a compound having a bond between a fluorine atom and an atom other than the fluorine atom, and a bond energy between the fluorine atom and the atom other than the fluorine atom is 2.5 eV or less.

7. The method for producing a semiconductor device according to claim 6, wherein the bond energy is in a range from 1.7 eV to 2.5 eV or less.

8. A method for removing (i) $MoF_x$, or (ii) a mixture of $MoF_x$ and $MoOF_x$, comprising:

bringing a halogen-containing gas into contact with a member having a deposit or a coating of (i) the $MoF_x$, or (ii) the mixture of $MoF_x$ and $MoOF_x$; and removing (i) the $MoF_x$, or (ii) the mixture of $MoF_x$ and $MoOF_x$ from the member, respectively, where x represents a number greater than 0 and less than 6, wherein the halogen-containing gas oxidizes (i) the $MoF_x$, or (ii) the mixture of $MoF_x$ and $MoOF_x$ to form a compound having a lower boiling point than a boiling point of (i) the $MoF_x$, or a boiling point of (ii) the mixture of $MoF_x$ and $MoOF_x$, respectively.

9. The method according to claim 8, wherein the halogen-containing gas is a fluorine-containing gas.

10. The method according to claim 8, wherein the halogen-containing gas is a fluorine gas.

11. The method according to claim 8, wherein the member with which the halogen-containing gas is brought into contact has a temperature in a range from 0° C. to 400° C.

12. The method according to claim 8, wherein the halogen-containing gas is selected from the group consisting of fluorine gas ($F_2$), chlorine trifluoride ($ClF_3$), iodine heptafluoride ($IF_7$), and molybdenum hexafluoride ($MoF_6$).

13. The method according to claim 8, wherein the halogen-containing gas is a gas of a compound having a bond between a fluorine atom and an atom other than the fluorine atom, and a bond energy between the fluorine atom and the atom other than the fluorine atom is 2.5 eV or less.

14. The method according to claim 13, wherein the bond energy is in a range from 1.7 eV to 2.5 eV.

* * * * *